US006182272B1

(12) United States Patent
Andreev et al.

(10) Patent No.: US 6,182,272 B1
(45) Date of Patent: Jan. 30, 2001

(54) METAL LAYER ASSIGNMENT

(75) Inventors: Alexander Andreev; Ivan Pavisic, both of San Jose; Pedja Raspopovic, Cupertino, all of CA (US)

(73) Assignee: LSI Logic Corporation, Milpitas, CA (US)

( * ) Notice: Under 35 U.S.C. 154(b), the term of this patent shall be extended for 0 days.

(21) Appl. No.: 09/118,661

(22) Filed: Jul. 16, 1998

(51) Int. Cl.$^7$ .................................................. G06F 17/50
(52) U.S. Cl. .............................................. 716/13; 716/15
(58) Field of Search .................................. 716/1, 2, 3, 8, 716/9, 10, 11, 12, 13, 14, 15, 16, 18

(56) References Cited

U.S. PATENT DOCUMENTS

| | | | |
|---|---|---|---|
| 4,500,963 | * | 2/1985 | Smith et al. ........................ 364/300 |
| 4,615,011 | * | 9/1986 | Linsker ................................. 716/13 |
| 4,713,773 | * | 12/1987 | Cooper et al. ...................... 364/491 |
| 4,768,154 | * | 8/1988 | Sliwkowski et al. ................. 716/15 |
| 4,777,606 | * | 10/1988 | Fournier .............................. 364/491 |
| 5,245,550 | * | 9/1993 | Miki et al. ........................... 716/13 |
| 5,404,313 | * | 4/1995 | Shiohara et al. ..................... 716/14 |
| 5,491,641 | | 2/1996 | Scepanovic et al. . |
| 5,495,419 | | 2/1996 | Rostoker et al. . |
| 5,519,632 | * | 5/1996 | Chen et al. .......................... 716/15 |
| 5,568,322 | | 10/1996 | Azami et al. . |
| 5,568,636 | | 10/1996 | Koford . |
| 5,578,840 | | 11/1996 | Scepanovic et al. . |
| 5,615,128 | | 3/1997 | Scepanovic et al. . |
| 5,636,125 | | 6/1997 | Rostoker et al. . |
| 5,638,293 | | 6/1997 | Scepanovic et al. . |
| 5,657,242 | * | 8/1997 | Sekiyama et al. ................... 716/15 |
| 5,661,663 | | 8/1997 | Scepanovic et al. . |
| 5,673,201 | * | 9/1997 | Malm et al. ......................... 716/12 |
| 5,682,322 | | 10/1997 | Boyle et al. . |
| 5,712,793 | | 1/1998 | Scepanovic et al. . |
| 5,729,467 | * | 3/1998 | Katsumata et al. ................ 364/489 |
| 5,742,510 | | 4/1998 | Rostoker et al. . |
| 5,745,363 | | 4/1998 | Rostoker et al. . |
| 5,808,899 | | 9/1998 | Scepanovic et al. . |
| 5,956,496 | * | 9/1999 | Schorn .................................. 716/1 |
| 6,006,024 | * | 12/1999 | Guruswamy et al. ................ 716/12 |

OTHER PUBLICATIONS

Chang et al., "An Efficient Approach to Multilayer Layer Assignment w/an Application to Via Minimization," IEEE Trans on CAD of 1Cs and Systems, vol. 18, No. 5, pp. 608–620, Feb. 11, 1998.*
Chou et al., "A Graph–Partitioning–Based Approach for Multi–Layer Constrained Via Mimimization," ICCAD98, pp 426–429, Feb. 1998.*
Joy et al., "Layer Assignment for PCBs and ICs," Proc. of IEEE, vol. 80, No. 2, pp 311–331, Feb. 1992.*
Heydari et al., "Algorithms and Bounds for Layer Assignment of MCM Routing," IEEE Trans on VLSI Systems, vol. 2, No. 2, pp265–270, Jun. 1994.*

* cited by examiner

Primary Examiner—Paul R. Lintz
Assistant Examiner—Leigh Marie Garbowski
(74) Attorney, Agent, or Firm—Mitchell, Silberberg & Knupp LLP

(57) ABSTRACT

Routing layers are assigned to connection segments in integrated circuit design. A routing description that includes connection segments and a vertex where at least two of the connection segments connect to each other is obtained. A penalty is determined for the vertex based on a potential layer assignment combination for the connection segments that connect at the vertex, and routing layers are assigned to the connection segments based on the determined penalty.

32 Claims, 7 Drawing Sheets

METAL LAYER ASSIGNMENT

BACKGROUND OF THE INVENTION

1. Field of the Invention

The present invention concerns integrated circuits (ICs) and IC design, and particularly relates to the assignment of specific metal layers to electrical connection (or wire) segments during integrated circuit design.

2. Description of the Related Art

FIG. 1 provides a simplified cross-sectional view of an integrated circuit chip (or die) 50, which includes a semiconductor layer 60, four metal layers 51 to 54, electrically insulating layers 57, and passivation layer 58. Semiconductor layer 60, which is typically polysilicon, is used for forming the transistors and other electronic devices and also may be used for routing some of the electrical connections between these electronic devices. However, wire routing occupies space on the semiconductor layer 60 which otherwise could be used for the electronic devices. As a result, ordinarily only the shorter electrical connections are formed on semiconductor layer 60. For the remainder of the connections, metal layers 51 to 54 are provided.

Metal layers 51 to 54 may be formed from any of a variety of materials including aluminum, copper or an electrically conductive alloy. To simplify the routing process, routing typically is performed using mainly horizontal and vertical electrical connection (or wire) segments. Moreover, to permit such routing to be performed in an orderly manner, each metal layer typically is designated as either a horizontal metal layer or a vertical metal layer. Horizontal metal layers are used primarily for horizontal wire segments and vertical metal layers are used primarily for vertical wire segments. Thus, integrated circuit chip 50 typically will have two of its metal layers designated as vertical layers (e.g., layers 51 and 53) and two of its metal layers designated as horizontal layers (e.g., layers 52 and 54). Ordinarily, horizontal and vertical metal layers are alternated so as to facilitate horizontal-to-vertical transitions. It is also common to number the metal layers in ascending order starting with the metal layer closest to the semiconductor layer. Thus, metal layers 51 to 54 would be referred to as M1 to M4, respectively. This designation is used herein.

Between each pair of adjacent metal layers and between metal layer 51 and semiconductor layer 60 is an electrically insulating layer 57, which typically is formed as an oxide film. Electrical connections between metal layers are made using interlayer holes called vias, while direct contacts can be made between semiconductor layer 60 and metal layer 51.

Passivation layer 58 functions to prevent the deterioration of the electrical properties of the die caused by water, ions and other external contaminants. Typically, passivation layer 58 is made of a scratch-resistant material such as silicon nitride and/or silicon dioxide.

As indicated above, current integrated circuits frequently include four metal layers. Moreover, the number of metal layers utilized has been increasing over the past few years, and it is expected that this trend will continue. However, in order to utilize such multiple metal layers, it is necessary to assign each wire segment to a specific metal layer. Unfortunately, until now, no systematic and efficient technique for assigning wire segments to specific metal layers has been proposed.

SUMMARY OF THE INVENTION

The present invention addresses the foregoing problem by determining a penalty for a vertex where two connection segments connect with each other and assigning routing layers based on that penalty.

Thus, in one aspect the invention is directed to assigning routing layers to connection segments in integrated circuit design. A routing description that includes connection segments and a vertex where at least two of the connection segments connect to each other is obtained. A penalty is determined for the vertex based on a potential layer assignment combination for the connection segments that connect at the vertex, and routing layers are assigned to the connection segments based on the determined penalty.

In another aspect, the invention is directed to assigning routing layers connection segments in integrated circuit design. A routing description that includes connection segments and a vertex where at least two of the plural connection segments connect to each other is obtained. Penalties are determined for each of plural vertices, one penalty for each potential layer assignment combination for the connection segments that connect at the vertex. Routing layers are then assigned to the connection segments based on the determined penalties.

By virtue of the foregoing arrangements, the present invention can often provide a systematic and efficient technique for assigning wire segments to metal layer resources. In more particularized aspects of the invention graphical structures are provided which can often greatly facilitate metal layer assignment.

In other particularized aspects of the invention, various metal layer assignment combinations are evaluated using a dynamic programming technique. By providing a technique for utilizing dynamic programming when assigning metal layers, the present invention frequently can provide optimal solutions based on specified constraints in a relatively short time period. Such constraints may include, for example, minimization of the amount of metal layer area occupied by vias.

The foregoing summary is intended merely to provide a brief description of the general nature of the invention. A more complete understanding of the invention can be obtained by referring to the claims and the following detailed description of the preferred embodiments in connection with the accompanying figures.

DETAILED DESCRIPTION OF THE PREFERRED EMBODIMENTS

We begin by defining certain terms used throughout the specification. An integrated circuit chip (hereafter referred to as an "IC" or a "chip") includes cells and connections between the cells formed on the surface of the semiconductor layer.

A "cell" is a group of one or more circuit elements such as transistors, capacitors, and other basic circuit elements grouped to perform a function. Each of the cells in an IC may have one or more pins, each of which may be connected to one or more other pins of the IC by wires. The wires connecting the pins on the IC typically are formed on the metal layers of the chip.

A "net" is a set of two or more pins which must be connected. A typical chip includes thousands, tens of thousands, or hundreds of the thousands of nets. A "netlist" is a list of nets on a chip, together with a list of required interconnections for each net.

IC Design Cycle

Figure 1:
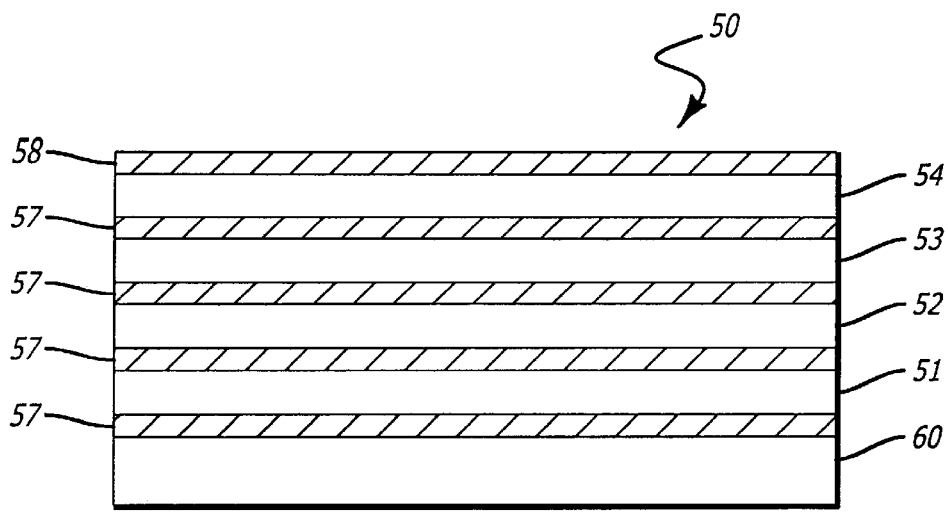
FIG. 1 provides a cross-sectional view of an integrated circuit die.
Figure 2:
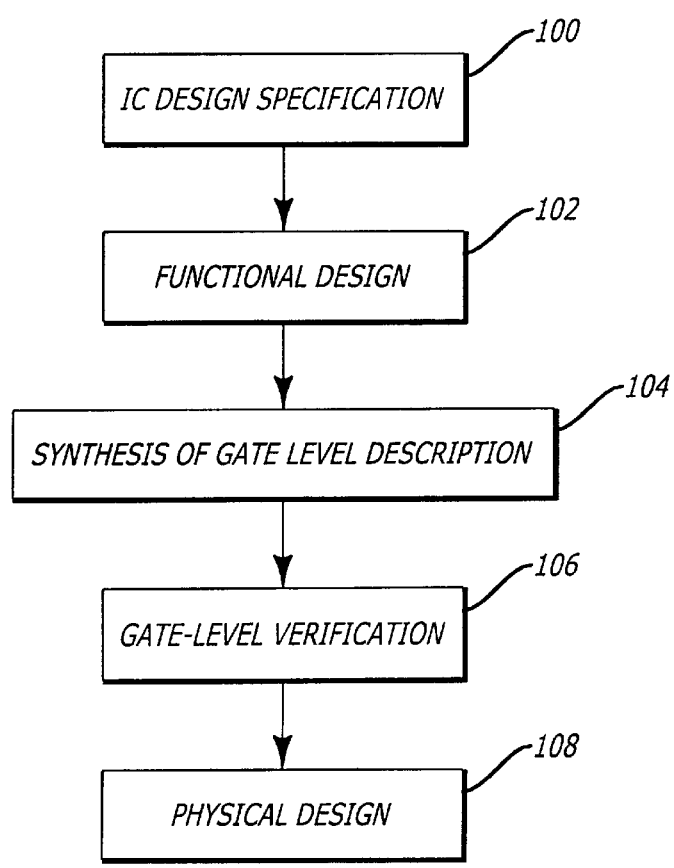
FIG. 2 is a flow diagram for explaining integrated circuit design according to a representative embodiment of the invention.

FIG. 2 illustrates a flow diagram for providing a brief overview of IC chip design according to a representative embodiment of the invention. Briefly, according to FIG. 2, an IC design specification is prepared; a functional description of a system corresponding to the design specification is produced; a gate-level circuit description is synthesized from the functional description; a simulation is performed to verify the feasibility of the gate-level description; and physical design is performed.

In more detail, in step 100 an IC design specification is prepared. At this initial step of the design cycle, the desired system design is described in the highest level of abstraction. Subsequent steps in the design cycle provide successively more detail until all information required to fabricate the chip has been derived. Preferably, the design specification dictates features such as performance criteria, required external interfaces and protocols, and product cost targets.

In step 102, a functional design is produced. The functional design describes a system that will satisfy the IC design specification prepared in step 100. Preferably, the functional design is written using a highly structured syntax so as to permit subsequent steps in the design cycle to be performed using automated computer-aided design tools. More preferably, the functional design is written in a hardware description language (HDL) such as VHDL (IEEE standard 1076-1993) or Verilog-HDL.

In step 104, a description of a gate-level circuit is synthesized based on the HDL code produced in step 102. Preferably, gate-level design is performed by running an automated synthesis tool on the HDL code. Upon execution of the synthesis tool, physically realizable gates and flip-flops are selected from a pre-defined library and are interconnected in a manner so as to satisfy the relationships and to perform the processing defined by the HDL code. Processing by the synthesis tool preferably utilizes pre-defined user design constraints which have been formulated in an effort to enhance the feasibility of the design, particularly with respect to problems which might otherwise not be discovered until later in the design cycle. The format of the gate-level circuit description synthesized in step 104 is a "netlist", which categorizes a number of "nets", each including one or more gates and/or flip-flops, and which also describes the interconnections between these nets.

In gate-level verification step 106, a computer simulation is run to test the circuit design synthesized during gate-level design step 104. The goals of this simulation are to determine whether all performance criteria have been met and whether any timing or other circuit errors will occur in response to a variety of different input signals and conditions. Upon completion of gate-level verification in step 106, the netlist is provided to physical design step 108, and a dump of top-level signals in the netlist is provided to the user.

In physical design step 108, the netlist generated in step 106 is mapped to information for physically implementing the corresponding circuit on an IC die. The objective of physical design is to determine an optimal arrangement of devices in a plane or in a three-dimensional space, and an efficient interconnection or routing scheme between the devices to obtain the desired functionality. One goal of physical design step 108 is to implement the design using minimum chip area. Other factors considered during physical design include thermal generation, power/ground noise, electromagnetic effects, and the number of metal layers available for wire routing.

Step 108 produces a set of design files in an unambiguous representation known as an intermediate format that describes the layout. The design files are then converted into pattern generator files that are used to produce patterns called masks by an optical or electron beam pattern generator. A representative embodiment of physical design step 108 is discussed in more detail below in connection with FIG. 3.

It should be noted that while one example of a particular design cycle is described above, variations of the foregoing may also be used, as will be apparent to those skilled in the art. In addition, although the foregoing design process is described above and shown in FIG. 2 as being purely sequential, many times one or more of the steps will need to be repeated. That is, if the design is found to be unfeasible at one step, an earlier step might need to be re-executed in order to correct the problem. For example, it might occur that in step 104 a gate-level description can not be generated to satisfy the functional design requirements using the available technology library, while at the same time maintaining the user's design constraints. In this case, the functional description may need to be redesigned in step 102 in order to achieve a feasible design.

Physical Design

Figure 3:
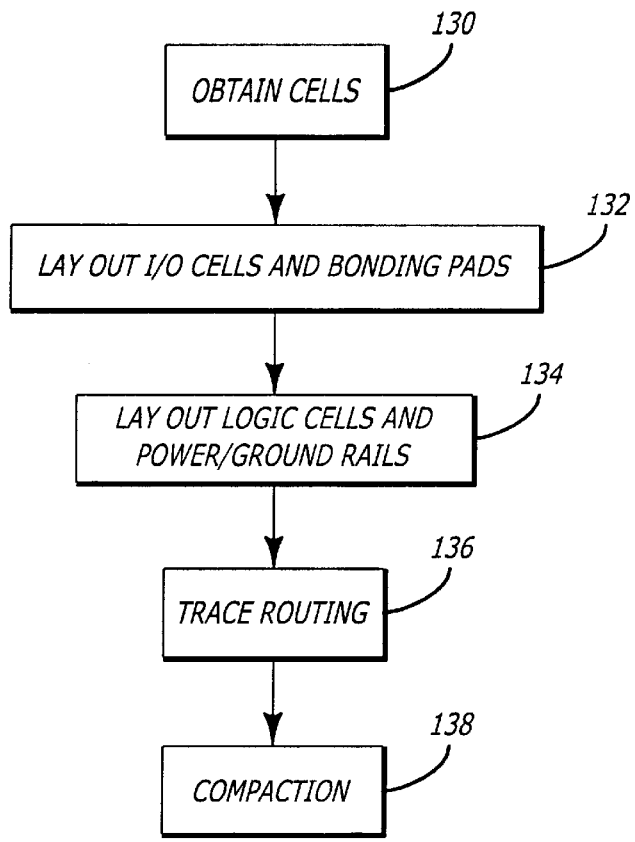
FIG. 3 is a flow diagram for explaining physical design according to a representative embodiment of the invention.

A more detailed discussion of physical design step 108 (shown in FIG. 2) in the preferred embodiment of the invention will now be discussed with reference to the flow diagram shown in FIG. 3. Briefly, according to FIG. 3, cells are obtained based on the supplied netlist; I/O cells and associated bonding pads are laid out around the periphery of the die; interior logic cells and power/ground rails are laid out; traces are routed between the cells; and compaction is performed.

In more detail, in step 130 cell descriptions are obtained from a cell library based on the netlist input from step 106. Specifically, logic and other signal processing cells, as well as I/O buffer cells, are obtained corresponding to the circuits identified in the netlist.

In step 132, the I/O buffer cells and associated bonding pads are laid out (or placed) around the periphery of the die. As used herein, layout or placement refers to generating layout or placement information. During device fabrication, discussed below, electronic devices and wires are formed on the IC die using the placement information generated during physical design.

In step 134, the logic cells are placed at the interior of the die. A main concern in performing this placement is to reduce spacing between cells, thereby minimizing the amount of wire routing that will need to be performed. The main sub-steps in performing step 134 are partitioning, floorplanning and layout.

The logic portion of a chip may contain several million transistors. As a result, layout of the entire chip generally cannot be handled due to the limitations of available memory space and computation power. Therefore, the logic circuitry normally is partitioned by grouping circuit components into blocks, such as subcircuits and modules. The actual partitioning process considers many factors such as the size of the blocks, number of blocks and number of interconnections between the blocks.

The output of partitioning is a set of blocks, together with the interconnections required between these blocks. In large circuits, the partitioning process is often hierarchical, although non-hierarchical (e.g. flat) processes can be used. At the topmost level of a hierarchical partitioning process, a circuit can have between 5 to 25 blocks. However, greater numbers of blocks are possible and contemplated. Each block is then partitioned recursively into smaller blocks.

Floor planning and placement are concerned with selecting good layout alternatives for each block of the entire chip, as well as between blocks and to the edges. Floor planning is a critical step as it sets up the ground work for a good layout. During placement, the blocks are exactly positioned on the chip. The goal of placement is to find a minimum area arrangement for the blocks that allows completion of interconnections between the blocks. Placement typically is done in two phases. In the first phase, an initial placement is created. In the second phase, the initial placement is evaluated and iterative improvements are made until the layout has minimum area and conforms to design specifications.

In one common layout technique, cells are generally arranged in cell columns, with each cell column bordered by a power rail and a ground rail. The spaces between the cell columns are referred to as channels and are used for wire routing. In particular, the channels can be used for wire routing which is difficult to perform over cells.

In step 136, traces are routed from the I/O cells and interior logic cells to other I/O and interior logic cells, as well as to power and ground rings. The objective of routing is to complete all the interconnections between cells and within each cell according to the specified netlist, subject to the space available for routing. Another goal of routing is to complete all circuit connections using the shortest possible wire length. Routing preferably is performed in two phases referred to as the global routing and detailed routing phases, each of which is described below in connection with FIG. 4.

In step 138, compaction is performed. Compaction is the process of compressing the layout in both directions such that the total area is reduced. By making the chips smaller, wire lengths are reduced, which in turn reduces the signal delay between components of the circuit. At the same time, a smaller area enables more chips to be produced on a wafer, which in turn reduces the cost of manufacturing. Compaction must ensure that no rules regarding the design and fabrication processes are violated.

While the foregoing implementation of physical design step 108 is preferable, other variations apparent to those skilled in the art may also be used. Moreover, although the steps are described above and shown in FIG. 3 as being entirely sequential, it should be understood that feasibility problems discovered in any one of the steps frequently will require repeating a prior step. For example, routing problems discovered in step 136 might require adjustments to layout by re-executing portions of step 134.

Wire Routing

Figure 4:
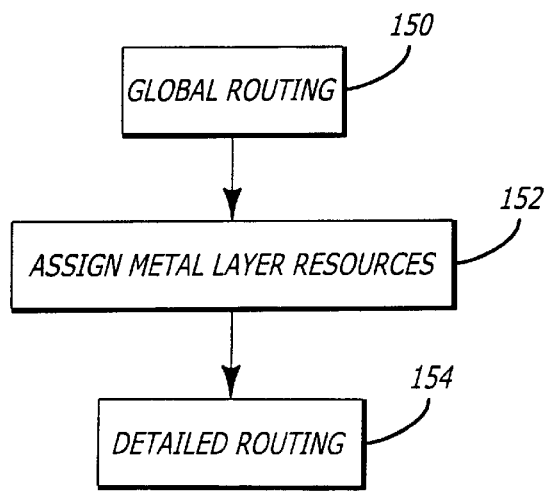
FIG. 4 is a flow diagram for explaining wire routing according to a preferred embodiment of the invention.

Trace routing step 136 (shown in FIG. 3) will now be discussed in more detail in connection with the flow diagram shown in FIG. 4. Briefly, according to FIG. 4, global routing is performed; wires are assigned to metal layers; and detailed routing is performed.

In more detail, in step 150 global routing is performed. In global routing, connections are completed between the proper blocks of the circuit disregarding the exact geometric details of each wire and terminal. For each wire, a global router finds a list of channels that are to be used as a passageway for that wire. In other words, global routing specifies the loose route of a wire through different regions of the routing space. Various techniques for obtaining a global routing are well known in the art, such as maze routing and Steiner tree based techniques. In the preferred embodiment, a Steiner tree based technique is used to route connections between pins using a coarse routing grid. More preferably, global routing uses the coarse routing grid illustrated in FIG. 5.

Figure 5:
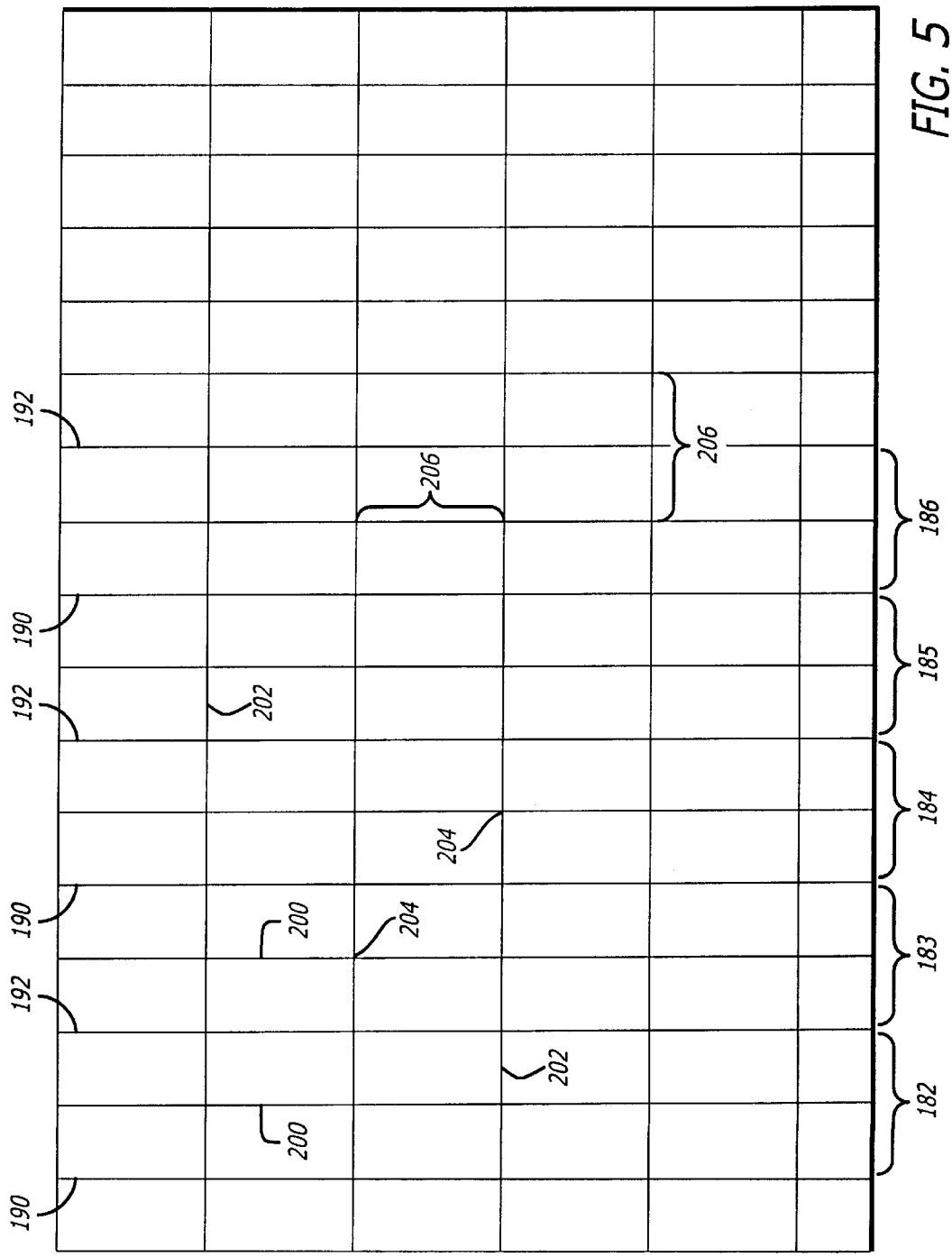
FIG. 5 illustrates a coarse grid utilized in global routing according to a representative embodiment of the invention.

FIG. 5 illustrates a preferred coarse routing grid superimposed on an integrated circuit chip. On the integrated circuit chip illustrated in FIG. 5, cells are laid out in cell columns, such as cell columns 182, 184 and 186. Between cell columns are channels, such as channels 183 and 185. Bordering each cell column is a power rail 190 and a ground rail 192. The coarse routing grid includes vertical grid lines 200 and horizontal grid lines 202. As shown in FIG. 5, a vertical grid line 200 runs through the center of each cell column and each channel. The distance between adjacent horizontal grid lines 202 is approximately equal to the distance between adjacent vertical grid lines 200. Points 204 are formed at the intersection of each vertical grid line 200 and each horizontal grid line 202. The grid line segment between any two horizontally adjacent points 204 or between any two vertically adjacent points 204 is referred to herein as an "edge", such as edges 206.

When performing global routing according to the preferred embodiment, the total capacity of each edge is determined. In this regard, "total capacity" refers to the total number of wires which can be routed on the edge in all metal layers. There are a number of ways to calculate the total capacity of an edge. However, in general, the total capacity of an edge will be the total capacity of the edge without blockages less the effects of any blockages. Typically, the total capacity of an unblocked edge will be eight to ten grids per metal layer having the same direction as the edge, where each grid is wide enough to carry a standard width wire.

Figure 6:
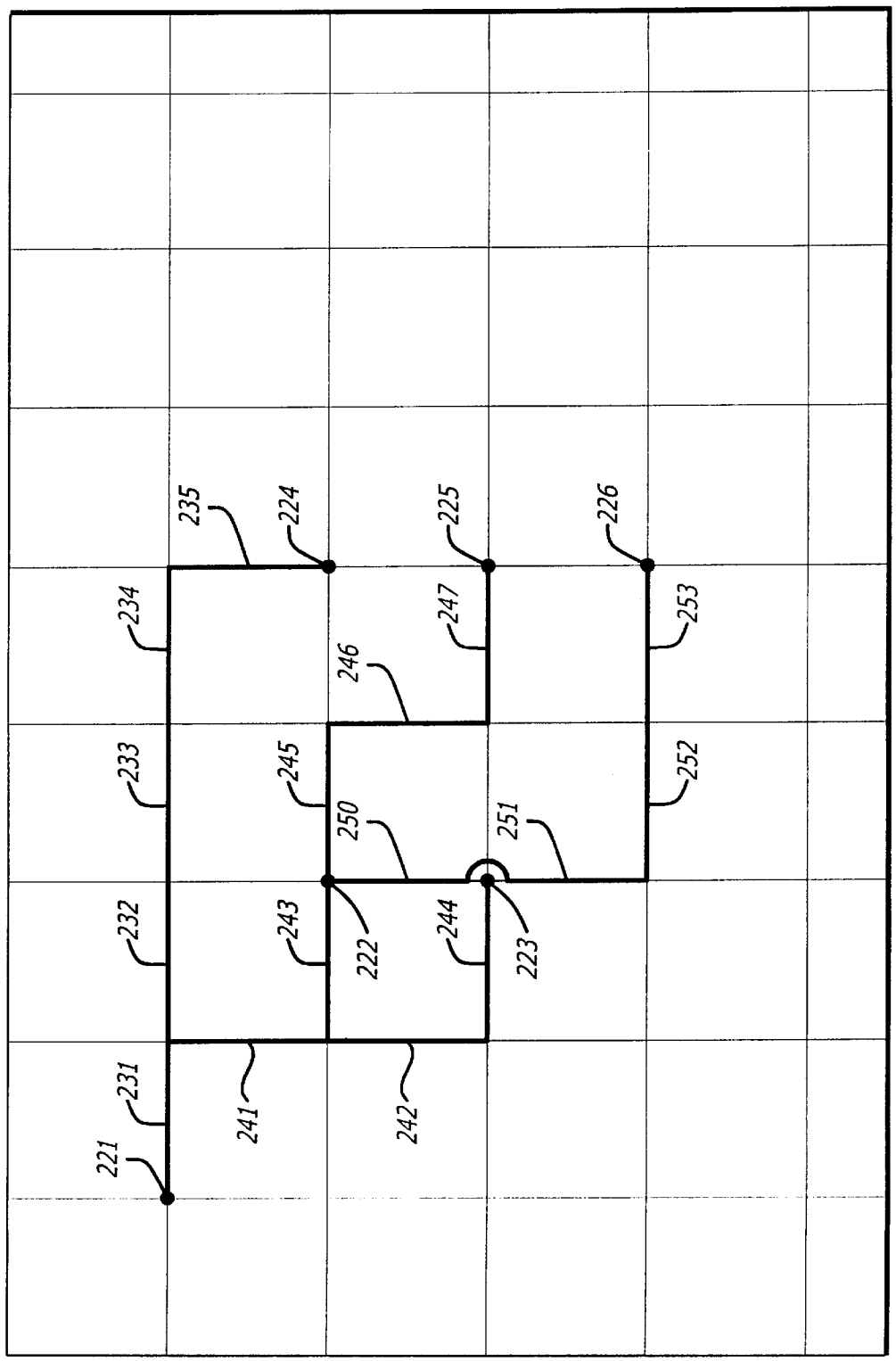
FIG. 6 illustrates the output of the global routing step for one net according to a representative embodiment of the invention.

FIG. 6 illustrates an example of a global routing for a six-pin net according to a representative embodiment of the invention. In particular, the net illustrated in FIG. 6 includes pins 221 to 226. The output of global routing step 150 preferably lists the edges used in interconnecting the net. Thus, pin 221 connects to pin 224 using horizontal edges 231 to 234 and vertical edge 235. Pin 221 connects to pin 222 using horizontal edge 231, vertical edge 241 and horizontal edge 243. Each of the other pin connections is made as shown in FIG. 6. It is noted that pin 222 connects to pin 226 using vertical edges 250 and 251 and horizontal edges 252 and 253. As indicated in FIG. 6, the routing from pin 222 to pin 226 crosses (in the x,y plane), but does not connect to, pin 223.

Referring again to FIG. 4, in step 152, each wire segment is assigned to a particular metal layer. This step is described in detail below in connection with the flow diagram shown in FIG. 7.

In step 154, detailed routing is performed. Detailed routing completes point-to-point connections between terminals on the blocks and includes channel routing and switch box routing. Preferably, detailed routing is grid-based. Thus, in the preferred embodiment, loose routing is converted into exact routing by specifying the geometric information such as width of wires and their assignments to particular grids.

Metal Layer Assignment

Figure 7:
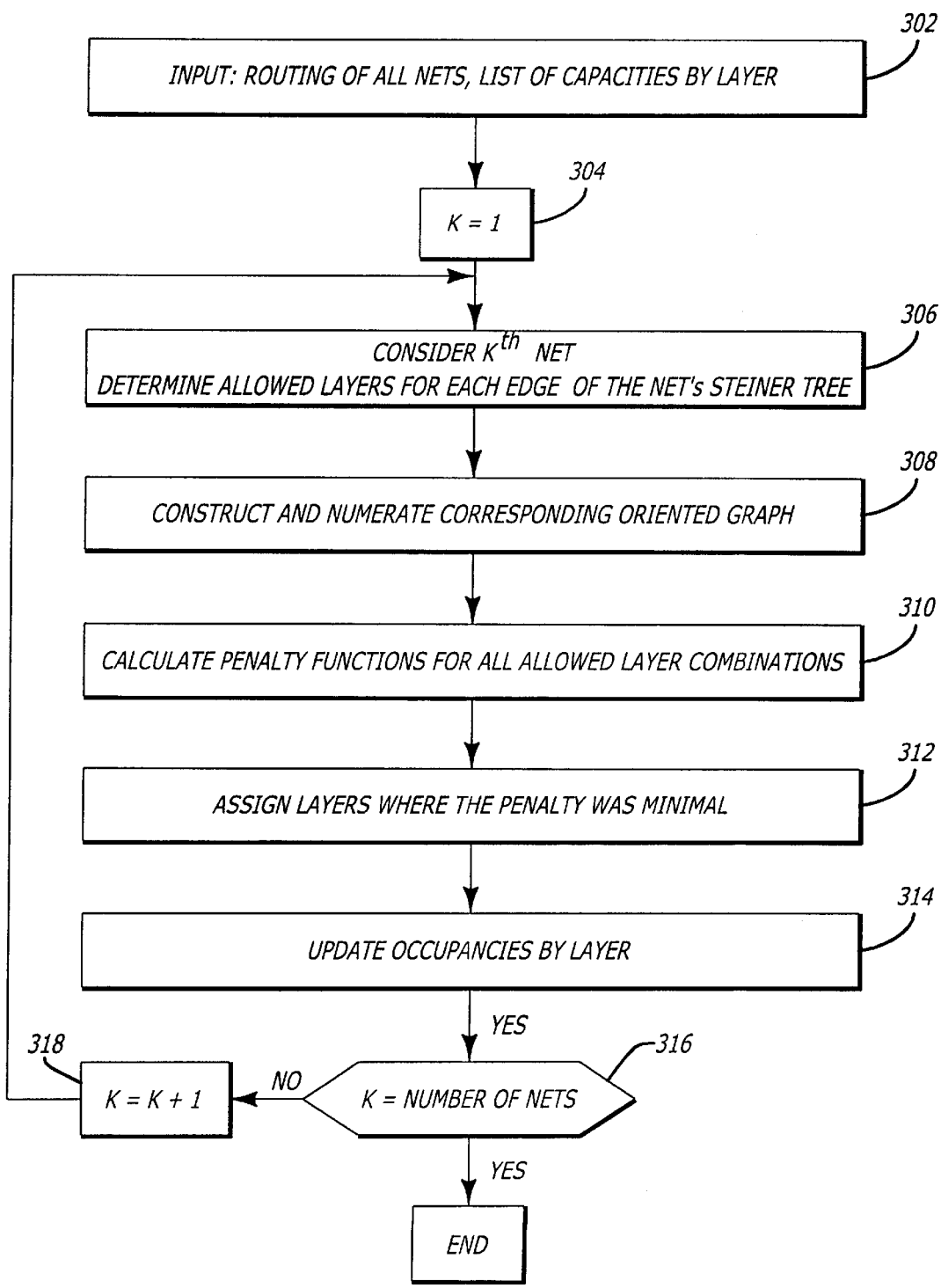
FIG. 7 is a flow diagram for explaining metal layer assignment according to a preferred embodiment of the invention.

Metal layer assignment step 152 (shown in FIG. 4) will now be described in detail with reference to the flow diagram shown in FIG. 7. Briefly, according to FIG. 7, (1) a global routing description for each net and a list of layer capacities are input; (2) the first net is selected as the current net; (3) the allowed layers are determined for each connection segment in the current net; (4) a graph is constructed and the connection segments are enumerated; (5) a penalty is determined for each allowed layer combination; (6) layers are assigned based on the combination which resulted in the minimum penalty; (7) occupancies are updated by layer; and then (8) steps 3–7 are repeated for each net.

In more detail, in step 302 the global routing description for each net (generated in step 150 ) and a list of capacities for each edge by metal layer are input. It is noted that while total capacity for a given edge was determined in step 150, in this step capacities for each edge are separately specified for each individual metal layer.

In step 304, the first net is selected as the current net by setting the counter k to 1.

In step 306, the allowed layers for each edge of the current net's global routing description are identified. Preferably, the allowed metal layers must satisfy the following two conditions: (1) the corresponding edge of the metal layer has available capacity; and (2) the relative occupancy of all corresponding edges on layers below the layer under consideration having the same direction (i.e., either horizontal or vertical) as the edge is not less than the relative occupancy of the corresponding edges on all layers having the same direction as the edge. Relative occupancy in this regard refers to the ratio of current occupancy to total capacity for an edge on a particular metal layer. It is noted that condition 2 is not strictly required, but is preferable to ensure that lower layers are filled at a rate at least equal to the overall rate.

In step 308, a graph is constructed for the current net, and the edges of the graph are enumerated. Specifically, the graph for the current net is constructed as follows. First, all the edges are connected as described in the global routing description. Then, one vertex is selected as a root, and all edges connecting at the root are oriented to point away from it. Each of the other edges is then oriented so that each vertex has only one edge pointing toward it. This can be accomplished by beginning with the root, moving downward through the tree, and orienting each connection segment encountered so as to point further down the tree. Preferably, the root is a vertex that has only one edge connected to it.

For a given edge, the edge's descendants are defined to be all edges that can be obtained by going from it in the direction specified by the edge orientation. Using this definition, the edges are enumerated so that each edge has a number higher than any of its descendants.

In step 310, penalty functions are calculated for all allowed layer combinations. This step can be performed by doing an exhaustive search in which a total penalty is determined for every possible layer assignment combination. However, because in the preferred embodiment the goal is to obtain the minimum total penalty, it is preferable to perform this step by using a dynamic programming technique. Moreover, it is noted that construction of the graph and enumeration of edges as in step 308 above has transformed the problem into one which is highly amenable to dynamic programming.

Preferably, the penalty for a vertex is defined as the maximum metal layer number of the edges entering the vertex minus the minimum metal layer number of the edges entering the vertex. The total penalty for a net is then defined as the sum of the penalties for all vertices in the net. Specifically, we define the function f(n,w) as a minimum penalty for a subtree associated with an edge w, under the condition that w lies on layer n. Assuming that (1) edge w enters a vertex v, (2) edges $w_1$ to $w_k$ exit vertex v and (3) $S_i$ is the set of allowed layers for the edge $w_i$, then $$f(n, w) = \min_{n_1 \in S_1} \ldots \min_{n_k \in S_k} \left( \max(n_1, \ldots, n_k) - \min(n_1, \ldots, n_k) + \sum_{i=1}^{k} f(n_1, w_i) \right).$$

In accordance with the preferred dynamic programming technique, each of the edges is processed using the foregoing penalty function in the order enumerated in step 308. As the value of an edge is determined, the combination of layers for its descendent edges on which the minimum value has been achieved is saved. Then, upon processing the last edge, metal layers are assigned based on the combination which achieved the overall minimum penalty.

By utilizing the foregoing dynamic programming technique, the combination of metal layers which results in the lowest combined penalty can be obtained faster than performing an exhaustive search. In particular, by proceeding in the foregoing manner, combinations which will not result in a minimum combined penalty are discarded at each step of the process, thereby reducing the total number of combinations which must be evaluated. An example of this technique will be described below in connection with FIGS. 8A and 8B.

In step 312, metal layers are assigned according to the combination which resulted in the minimum combined penalty.

In step 314, the layer occupancies are updated to reflect the assignments made in step 312.

In step 316, it is determined whether the current net is the last net. If not, then in step 318 the next net is selected and processing proceeds to step 306 to repeat the foregoing steps for the next net. Otherwise, metal layer assignment for the chip is completed.

It is noted that in the preferred embodiment of the invention metal layers are assigned for each edge of the global routing description of a net. However, it is not intended that the invention be limited to identifying metal layers in increments of an edge. Rather, the invention is applicable to finding metal layers for connection segments of any length, and in particular may be applied to lengths that are independent of any underlying global routing grid used. Accordingly, use of the term "edge" in the foregoing description of metal layer assignment should be understood as simply a special case of a connection segment.

Also, the preferred embodiment utilizes a particular penalty function that will tend to reduce the amount of metal layer space required for vias. However, other penalty functions achieving this goal, and/or achieving various other goals, may instead be used. Similarly, while the preferred embodiment seeks the minimum total penalty for each net, other embodiments may base layer assignment on total penalty in connection with one or more additional criteria.

Figure 8A:
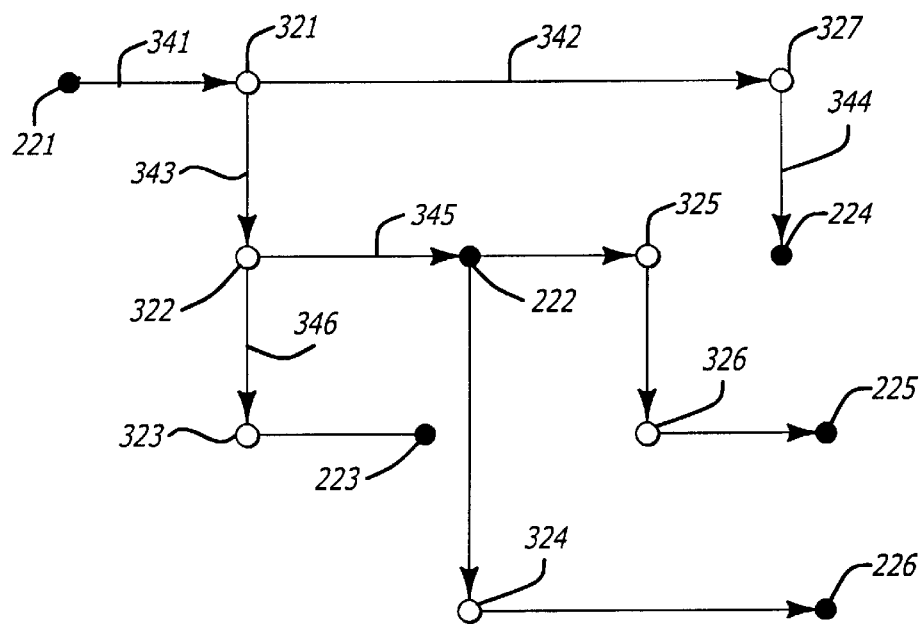
FIGS. 8A and 8B illustrate one example of metal layer assignment according to a preferred embodiment of the invention.
Figure 8B:
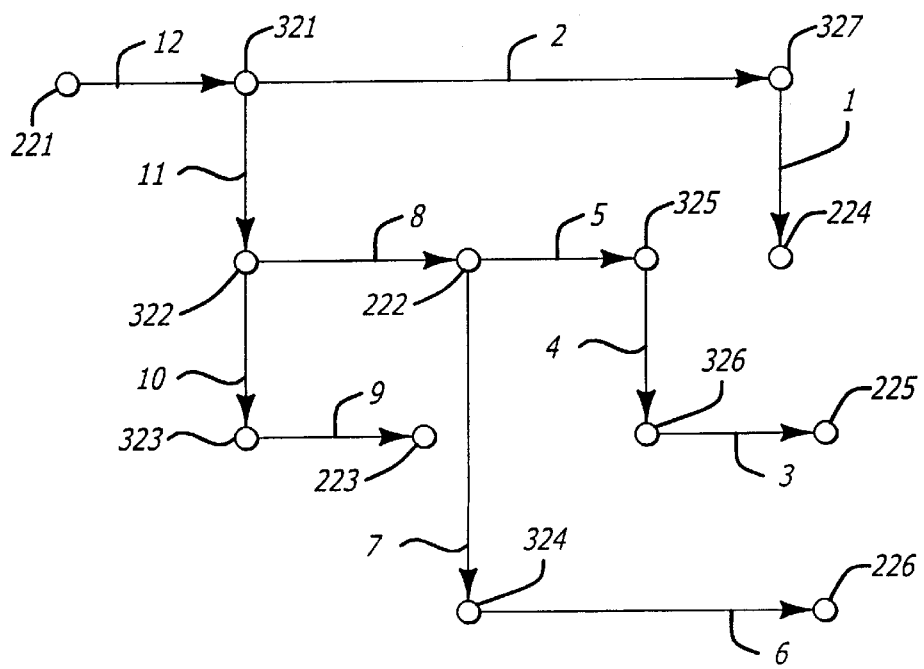

An example of steps 308 and 310 will now be described with reference to FIGS. 8A and 8B. The following example is based on the global routing description shown in FIG. 6. However, in order to simplify the example, the number of vertices, and therefore also the number of connection segments, has been reduced. Specifically, as noted above, in the preferred embodiment each edge is treated as a separate connection segment. In the present example, however, multiple edges which merely continue in a straight line are treated as a single connection segment. The present example also assumes that there are four metal layers, of which metal layers M1 and M3 are the vertical metal layers and metal layers M2 and M4 are the horizontal metal layers.

Initially, as described in connection with the description of step 308, a graph is constructed. In this case, vertex 221 is selected as the root. Only one segment, segment 341, connects with vertex 221. Therefore, as shown in FIG. 8A, connection segment 341 is oriented away from vertex 221. Also as shown in FIG. 8A, each of the other connection segments is oriented so that all other vertices have only one connection segment so as to point toward it. Thus, segment 341 points away from vertex 221; segments 342 and 343 point away from vertex 321; segment 344 points away from vertex 327; and segments 345 and 346 point away from vertex 322. Continuing in this manner, a directed graph according to step 308 is generated.

Next, the connection segments are numbered so that each segment has a number higher than any of its descendants. One example of such numbering is shown in FIG. 8B. In particular, the connection segments in FIG. 8B are numbered from 1 to 12 in this manner.

Finally, the connection segments are processed in the numbered order. Unless otherwise specified, in the following example it is assumed that each vertical metal layer is an allowable layer for each vertical connection segment and each horizontal metal layer is an allowable layer for each horizontal connection segment. The processing of the graph illustrated in FIG. 8B therefore proceeds as follows.

The first segment 1 is a vertical segment and therefore can be implemented on metal layer M1 or metal layer M3. If implemented on metal layer M1, the penalty for the segment is zero because pin 224 can connect directly to metal layer M1. On the other hand, if implemented on metal layer M3, the penalty is 2 (i.e., M3−M1). These options can be illustrated using the following shorthand notation:

$$1_1;0 \tag{1}$$

$$1_3;2 \tag{2}$$

Proceeding to connection segment 2, it is noted that segment 2 is a horizontal segment and therefore can be implemented on metal layer M2 or on metal layer M4. If implemented on metal layer M2, we would choose connection segment 1 to be implemented on metal layer M1, because in that case the total accumulated penalty would be only 1 (M2−M1+0). It is noted that if we had instead selected metal layer M3 for segment 1 in this case, then the total accumulated penalty would be 3 (M3−M2+2).

On the other hand, if connection segment 2 were implemented on metal layer M4, then we would be indifferent as to which metal layer connection segment 1 is implemented on, because both would result in an accumulated penalty of 3 (i.e., either M4−M1+0 or M4−M3+2). In such a case, we can keep track of both options or arbitrarily eliminate one. In order to reduce the number of combinations we need to evaluate, it is preferable to make an arbitrary choice. Thus, we will arbitrarily decide that connection segment 1 should be implemented on metal layer M3 in the event that connection segment 2 is implemented on metal layer M4. The following shorthand notation illustrates the options and their corresponding accumulated penalties up to this point:

$$2_2 1_1;1 \tag{3}$$

$$2_4 1_3;3 \tag{4}$$

From the foregoing, it can be seen that two combinations have already been eliminated; $2_2 1_3$ and $2_4 1_1$, the combination $2_2 1_3$ being obviously inferior and the combination $2_4 1_1$ being no better than an existing combination. Moreover, the effects of such elimination propagate throughout the tree, effectively eliminating even more undesirable combinations.

We next proceed to connection segment 3. Segment 3 can be implemented on either horizontal metal layer M2 (at a penalty of 1) or horizontal metal layer M4 (at a penalty of 3). These options are denoted as follows:

$$3_2;1 \tag{5}$$

$$3_4;3 \tag{6}$$

Next proceeding to connection segment 4, it is noted that segment 4 can be implemented on metal layer M1 or metal layer M3. In either case, the lowest aggregate penalty will be achieved by implementing segment 3 on metal layer M2. These options are summarized as follows:

$$4_1 3_2;2 \tag{7}$$

$$4_3 3_2;2 \tag{8}$$

Next, connection segment 5 can be implemented on metal layer M2 or metal layer M4. If implemented on metal layer M2, we can choose path (7) or path (8). The penalty is the same regardless of which option we choose. Accordingly, we arbitrarily choose path (8).

On the other hand, if connection segment 5 is implemented on metal layer M4, we can choose path (7) or path (8). In this case, path (8) results in a lower aggregate penalty and therefore path (8) is chosen. These two new paths and their aggregate penalties are indicated below:

$$5_2 4_2 3_2;3 \tag{9}$$

$$5_4 4_3 3_2;3 \tag{10}$$

Continuing on, segment 6 can be implemented on metal layer M2 at a penalty of 1 or on metal layer M4 at a penalty of 3, as indicated below:

$$6_2;1 \tag{11}$$

$$6_4;3 \tag{12}$$

Connection segment 7 can be implemented on metal layer M1 or metal layer M3. If implemented on metal layer M1, the lower aggregate penalty will be achieved by implementing segment 6 on metal layer M2. On the other hand, if segment 7 is implemented on metal layer M3, the aggregate penalty will be minimized be implementing segment 6 on metal layer M2. These new paths and their aggregate penalties are denoted as follows:

$$7_1 6_2;2 \tag{13}$$

$$7_3 6_2;2 \tag{14}$$

Next, connection segment 8 can be implemented on metal layer M2 or metal layer M4. For each situation, we evaluate all combinations of the options for segment 5 (paths (9) and (10)) and the options for segment 7 (paths (13) and (14)).

These options and their associated aggregate penalties for the situation where segment 8 is implemented on M2 are noted below.

$$8_2(9)(13);6 \quad (15.1)$$

$$8_2(9)(14);6 \quad (15.2)$$

$$8_2(10)(13);8 \quad (15.3)$$

$$8_2(10)(14);8 \quad (15.4)$$

For instance, implementing segment 8 on metal layer M2 in connection with path (9) and path (13) results in an aggregate penalty of 6. This aggregate penalty is calculated as follows. For vertex 222, the minimum metal layer number is M1 and the maximum metal layer number is M2, and 2−1=1. Add to this value the penalty of path (9) and the penalty of path (13), and the total penalty is calculated as 1+3+2=6. Each of the other potential paths (15.2) through (15.4) has been evaluated in a similar manner. In this case, paths (15.1) and (15.2) provide the lowest aggregate penalty. Accordingly, we arbitrarily choose path (15.1).

We perform the same evaluation for the case that segment 8 is implemented on metal layer M4, with the following results:

$$8_4(9)(13);8 \quad (16.1)$$

$$8_4(9)(14);7 \quad (16.2)$$

$$8_4(10)(13);8 \quad (16.3)$$

$$8_4(10)(14);6 \quad (16.4)$$

Potential path (16.4) provides the lowest aggregate penalty, and therefore is selected.

The foregoing best options for $8_2$ and $8_4$, together with their aggregate penalties, are denoted as follows:

$$\begin{array}{c} 5_2 4_3 3_2 \\ 8_2 \quad ;6 \\ 7_1 6_2 \end{array} \quad (15)$$

$$\begin{array}{c} 5_4 4_3 3_2 \\ 8_4 \quad ;6 \\ 7_3 6_2 \end{array} \quad (16)$$

Proceeding in this manner, each connection segment is processed in turn. When the root has been processed, the aggregate penalty for each remaining combination will be the total penalty for the combination. Accordingly the combination providing the minimum total penalty can be easily selected and the metal layers assigned as specified by that combination.

As will be appreciated from the foregoing example, utilizing the dynamic programming technique of the present invention can significantly increase the speed of identifying a minimum total penalty layer assignment combination by eliminating combinations that are inferior at each step of the process. Even faster solutions can be obtained by eliminating combinations that are merely equally as good as other combinations. However, in certain embodiments, such as where additional criteria are to be considered, it may be desirable to retain such equally good combinations.

Fabrication

Upon completion of design, as described above, the integrated circuit can be fabricated using the masks generated in step 108 (shown in FIG. 2), but otherwise employing conventional fabrication techniques. During fabrication, the masks generated in step 108 are used to pattern a silicon wafer using a sequence of photolithographic steps. Photolithography is a common technique employed in the manufacture of semiconductor devices. Typically, a semiconductor wafer is coated with a layer (film) of light-sensitive material, such as photoresist. Using a patterned mask or reticle, the wafer is exposed to projected light, typically actinic light, which manifests a photochemical effect on the photoresist, which is subsequently chemically etched, leaving a pattern of photoresist "lines" on the wafer corresponding to the pattern on the mask.

The above-mentioned "wafer" is a thin piece of semiconductor material from which semiconductor chips are made. The four basic operations utilized to fabricate wafers include (1) layering, (2) patterning, (3) doping and (4) heat treatments.

The layering operation adds thin layers of material, including insulators, semiconductors, and conductors, to a wafer surface. During the layering operation, layers are either grown or deposited. Oxidation typically involves growing a silicon dioxide (an insulator) layer on a silicon wafer. Deposition techniques include, for example, chemical vapor deposition, evaporation, and sputtering. Semiconductors are generally deposited by chemical vapor deposition, while conductors are generally deposited with evaporation or sputtering.

Patterning involves the removal of selected portions of surface layers. After material is removed, the wafer surface has a pattern. The material removed may form a hole or an island. The process of patterning is also known to those skilled in the relevant art as microlithography, photolithography, photomasking and masking. The patterning operation serves to create parts of the semiconductor device on the wafer surface in the dimensions required by the circuit design and to locate the parts in their proper location on the wafer surface.

Doping involves implanting dopants in the surface of the wafer through openings in the layers to create the n-type and p-type pockets needed to form the N-P junctions for operation of discrete elements such as transistors and diodes. Doping generally is achieved with thermal diffusion (wafer is heated and exposed to the desired dopant) and ion implantation (dopant atoms are ionized, accelerated to high velocities and implanted into the wafer surface).

Design System Environment

Figure 9:
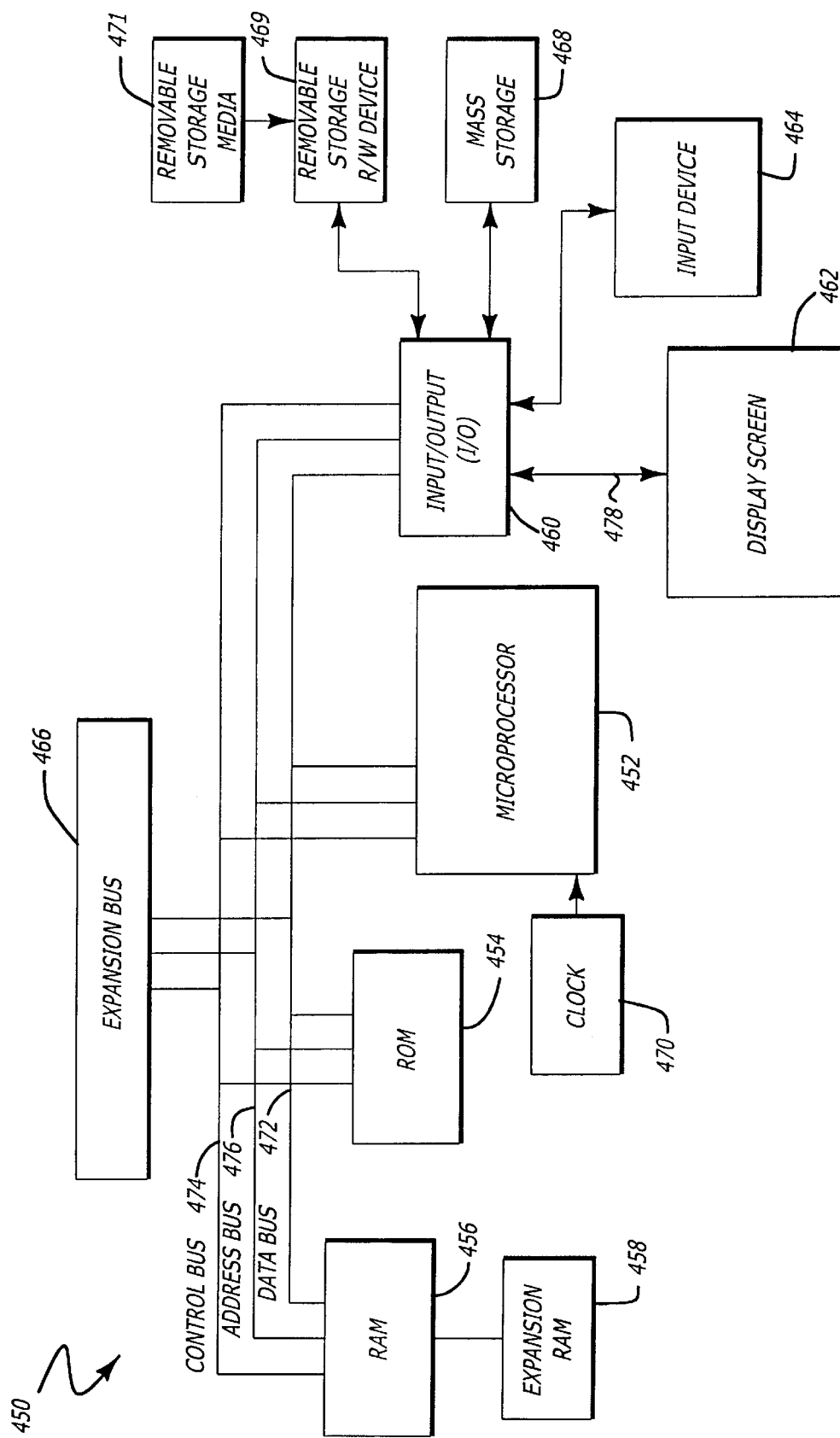
FIG. 9 is a block diagram of a general purpose computer system, representing one suitable computer platform for implementing the methods of the invention.

Generally, the methods described herein with respect to IC design will be practiced with a general purpose computer, either with a single processor or multiple processors. FIG. 9 is a block diagram of a general purpose computer system, representing one of many suitable computer platforms for implementing the methods described above. FIG. 9 shows a general purpose computer system 450 in accordance with the present invention. As shown in FIG. 9, computer system 450 includes a central processing unit (CPU) 452, read-only memory (ROM) 454, random access memory (RAM) 456, expansion RAM 458, input/output (I/O) circuitry 460, display assembly 462, input device 464, and expansion bus 466. Computer system 450 may also optionally include a mass storage unit 468 such as a disk drive unit or nonvolatile memory such as flash memory and a real-time clock 470.

CPU 452 is coupled to ROM 454 by a data bus 472, control bus 474, and address bus 476. ROM 454 contains the basic operating system for the computer system 450. CPU 452 is also connected to RAM 456 by busses 472, 474, and 476. Expansion RAM 458 is optionally coupled to RAM 456 for use by CPU 452. CPU 452 is also coupled to the I/O circuitry 460 by data bus 472, control bus 474, and address bus 476 to permit data transfers with peripheral devices.

I/O circuitry 460 typically includes a number of latches, registers and direct memory access (DMA) controllers. The purpose of I/O circuitry 460 is to provide an interface between CPU 452 and such peripheral devices as display assembly 462, input device 464, and mass storage 468.

Display assembly 462 of computer system 450 is an output device coupled to I/O circuitry 460 by a data bus 478. Display assembly 462 receives data from I/O circuitry 460 via bus 478 and displays that data on a suitable screen.

The screen for display assembly 462 can be a device that uses a cathode-ray tube (CRT), liquid crystal display (LCD), or the like, of the types commercially available from a variety of manufacturers. Input device 464 can be a keyboard, a mouse, a stylus working in cooperation with a position-sensing display, or the like. The aforementioned input devices are available from a variety of vendors and are well known in the art.

Some type of mass storage 468 is generally considered desirable. However, mass storage 468 can be eliminated by providing a sufficient mount of RAM 456 and expansion RAM 458 to store user application programs and data. In that case, RAMs 456 and 458 can optionally be provided with a backup battery to prevent the loss of data even when computer system 450 is turned off. However, it is generally desirable to have some type of long term mass storage 468 such as a commercially available hard disk drive, nonvolatile memory such as flash memory, battery backed RAM, PC-data cards, or the like.

A removable storage read/write device 469 may be coupled to I/O circuitry 460 to read from and to write to a removable storage media 471. Removable storage media 471 may represent, for example, a magnetic disk, a magnetic tape, an opto-magnetic disk, an optical disk, or the like. Instructions for implementing the inventive method may be provided, in one embodiment, to a network via such a removable storage media.

In operation, information is input into the computer system 450 by typing on a keyboard, manipulating a mouse or trackball, or "writing" on a tablet or on position-sensing screen of display assembly 462. CPU 452 then processes the data under control of an operating system and an application program, such as a program to perform steps of the inventive method described above, stored in ROM 454 and/or RAM 456. CPU 452 then typically produces data which is output to the display assembly 462 to produce appropriate images on its screen.

Expansion bus 466 is coupled to data bus 472, control bus 474, and address bus 476. Expansion bus 466 provides extra ports to couple devices such as network interface circuits, modems, display switches, microphones, speakers, etc. to CPU 452. Network communication is accomplished through the network interface circuit and an appropriate network.

Suitable computers for use in implementing the present invention may be obtained from various vendors. Various computers, however, may be used depending upon the size and complexity of the OPC tasks. Suitable computers include mainframe computers, multiprocessor computers, workstations or personal computers. In addition, although a general purpose computer system has been described above, a special-purpose computer may also be used.

It should be understood that the present invention also relates to machine readable media on which are stored program instructions for performing the methods of this invention. Such media includes, by way of example, magnetic disks, magnetic tape, optically readable media such as CD ROMs, semiconductor memory such as PCMCIA cards, etc. In each case, the medium may take the form of a portable item such as a small disk, diskette, cassette, etc., or it may take the form of a relatively larger or immobile item such as a hard disk drive or RAM provided in a computer.

CONCLUSION

Although the present invention has been described in detail with regard to the exemplary embodiments and drawings thereof, it should be apparent to those skilled in the art that various adaptations and modifications of the present invention may be accomplished without departing from the spirit and the scope of the invention. Accordingly, the invention is not limited to the precise embodiments shown in the drawings and described in detail above. Therefore, it is intended that all such variations not departing from the spirit of the invention be considered as within the scope thereof as limited solely by the claims appended hereto.

In the following claims, those elements which do not include the words "means for" are intended not to be interpreted under 35 U.S.C. §112 ¶6.

What is claimed is:

1. A method for assigning routing layers to connection segments in integrated circuit design, said method comprising:

an obtaining step of obtaining a routing description of a net that includes plural connection segments and plural vertices, each of the plural vertices being a vertex;

a generating step of generating a tree-shaped routing graph from the routing description by selecting one of the plural vertices to be a root and forming edges corresponding to the connection segments such that each vertex other than the root has only one edge leading to it from a next higher hierarchical level;

a determining step of determining penalty values for plural different potential routing layer assignment combinations by traversing the tree-shaped routing graph in a bottom-up fashion, wherein each potential routing layer assignment combination represents one possible combination of assignments of at least a subset of the edges to specific routing layers; and an assigning step of assigning routing layers to the plural connection segments based on the penalty values determined in said determining step.

2. A method according to claim 1, wherein each of the plural connection segments is one of a vertical segment and a horizontal segment.

3. A method according to claim 1, wherein the routing description provides only a coarse routing description.

4. A method according to claim 1, wherein the penalty values are determined at the vertices of the routing graph, and wherein the penalty value for each vertex is defined with respect to a particular potential routing layer assignment combination as: (i) a maximum routing layer number for all edges connecting at said each vertex minus a minimum routing layer number for all edges connecting at said each vertex; plus (ii) the penalty values, still assuming said particular potential routing layer assignment combination, for all vertices that are immediate descendants of said each vertex.

5. A method according to claim 4, wherein said determining step determines a separate penalty value for each of a plurality of said plural different potential routing layer assignment combinations for a single vertex.

6. A method according to claim 5, wherein the plural different potential routing layer assignment combinations are identified by determining, for a particular routing layer, whether a relative occupancy of connection segments on all routing layers of a same direction as the particular routing layer and below the particular routing layer is less than the relative occupancy of connection segments on all routing layers of the same direction as the particular routing layer.

7. A method according to claim 1, wherein plural of the edges have descendants in the tree-shaped routing graph, and wherein in said determining step no edge is processed prior to any of its descendants.

8. A method according to claim 1, wherein as the tree-shaped routing graph is traversed at least some of the potential routing layer assignment combinations are eliminated.

9. A method according to claim 8, wherein said determining step comprises:
    identifying situations when at least two of the plural different potential routing layer assignment combinations result in a same routing layer assignment for the one edge leading to a particular vertex from the next higher hierarchical level; and
    determining whether said at least two of the plural different potential routing layer assignment combinations result in different penalty values for said particular vertex and, if so, eliminating an inferior one of said at least two of the plural different potential routing layer assignment combinations.

10. A method according to claim 1, wherein the penalty values are determined at the vertices of the routing graph, and wherein the penalty value for each vertex is defined with respect to a particular potential routing layer assignment combination as: (i) a first component that is based on routing layer assignments for all edges connecting at said each vertex; plus (ii) the penalty values, still assuming said particular potential routing layer assignment combination, for all vertices that are immediate descendants of said each vertex.

11. A method according to claim 10, wherein, for each vertex, a penalty value is determined for each potential routing layer assignment combination remaining for the vertices below said each vertex in the tree-shaped routing graph.

12. A method according to claim 11, wherein inferior potential routing layer assignment combinations, as determined by the penalty values, are eliminated when processing each vertex.

13. A method according to claim 1, further comprising a step of enumerating the edges so that each edge has a higher number than any of its descendants, and wherein in said determining step the edges are processed in order of the enumeration.

14. A method according to claim 13, wherein the edges are processed using dynamic programming to identify a layer assignment combination for all of the edges having a minimum combined penalty.

15. A method according to claim 1, further comprising an identifying step of identifying allowable routing layers for each edge.

16. A method according to claim 15, wherein the allowable routing layers for a particular edge include only those routing layers for which both: (1) there is space for the particular edge; and (2) a relative occupancy of edges corresponding to the particular connection segment on lower routing layers having a same direction as the particular edge is not less than the relative occupancy of corresponding edges on all routing layers having the same direction as the particular edge.

17. A method according to claim 1, wherein said determining step is performed by utilizing dynamic programming.

18. A method according to claim 1, wherein said obtaining step, said determining step said generating step and said assigning step are performed for each net to be implemented in the integrated circuit design.

19. An apparatus for assigning routing layers to connection segments in integrated circuit design, said apparatus comprising:
    obtaining means for obtaining a routing description of a net that includes plural connection segments and plural vertices, each of the plural vertices being a vertex;
    generating means for generating a tree-shaped routing graph from the routing description by selecting one of the plural vertices to be a root and forming edges corresponding to the connection segments such that each vertex other than the root has only one edge leading to it from a next higher hierarchical level;
    determining means for determining penalty values for plural different potential routing layer assignment combinations by traversing the tree-shaped routing graph in a bottom-up fashion, wherein each potential routing layer assignment combination represents one possible combination of assignments of at least a subset of the edges to specific routing layers; and
    assigning means for assigning routing layers to the plural connection segments based on the penalty values determined by said determining means.

20. An apparatus according to claim 19, said determining means comprises means for performing dynamic programming.

21. An apparatus according to claim 19, wherein the penalty values are determined at the vertices of the routing graph, and wherein the penalty value for each vertex is defined with respect to a particular potential routing layer assignment combination as: (i) a first component that is based on routing layer assignments for all edges connecting at said each vertex; plus (ii) the penalty values, still assuming said particular potential routing layer assignment combination, for all vertices that are immediate descendants of said each vertex.

22. An apparatus according to claim 21, wherein, for each vertex, a penalty value is determined for each potential routing layer assignment combination remaining for the vertices below said each vertex in the tree-shaped routing graph.

23. An apparatus according to claim 22, wherein inferior potential routing layer assignment combinations, as determined by the penalty values, are eliminated when processing each vertex.

24. An apparatus according to claim 19, wherein as the tree-shaped routing graph is traversed at least some of the potential routing layer assignment combinations are eliminated.

25. An apparatus according to claim 24, wherein said determining includes means for:
    identifying situations when at least two of the plural different potential routing layer assignment combinations result in a same routing layer assignment for the one edge leading to a particular vertex from the next higher hierarchical level; and
    determining whether said at least two of the plural different potential routing layer assignment combinations result in different penalty values for said particular vertex and, if so, eliminating an inferior one of said at least two of the plural different potential routing layer assignment combinations.

26. A computer-readable medium storing computer-executable process steps for assigning routing layers to connection segments in integrated circuit design, said process steps comprising:

an obtaining step to obtain a routing description of a net that includes plural connection segments and plural vertices, each of the plural vertices being a vertex;

a generating step to generate a tree-shaped routing graph from the routing description by selecting one of the plural vertices to be a root and forming edges corresponding to the connection segments such that each vertex other than the root has only one edge leading to it from a next higher hierarchical level;

a determining step to determine penalty values for plural different potential routing layer assignment combinations by traversing the tree-shaped routing graph in a bottom-up fashion, wherein each potential routing layer assignment combination represents one possible combination of assignments of at least a subset of the edges to specific routing layers; and an assigning step to assign routing layers to the plural connection segments based on the penalty values determined in said determining step.

27. A computer-readable medium according to claim 26, wherein said determining step is performed by utilizing dynamic programming.

28. A computer-readable medium according to claim 26, wherein the penalty values are determined at the vertices of the routing graph, and wherein the penalty value for each vertex is defined with respect to a particular potential routing layer assignment combination as: (i) a first component that is based on routing layer assignments for all edges connecting at said each vertex; plus (ii) the penalty values, still assuming said particular potential routing layer assignment combination, for all vertices that are immediate descendants of said each vertex.

29. A computer-readable medium according to claim 28, wherein, for each vertex, a penalty value is determined for each potential routing layer assignment combination remaining for the vertices below said each vertex in the tree-shaped routing graph.

30. A computer-readable medium according to claim 29, wherein inferior potential routing layer assignment combinations, as determined by the penalty values, are eliminated when processing each vertex.

31. A computer-readable medium according to claim 26, wherein as the tree-shaped routing graph is traversed at least some of the potential routing layer assignment combinations are eliminated.

32. A computer-readable medium according to claim 31, wherein said determining step comprises steps to:

identify situations when at least two of the plural different potential routing layer assignment combinations result in a same routing layer assignment for the one edge leading to a particular vertex from the next higher hierarchical level; and determine whether said at least two of the plural different potential routing layer assignment combinations result in different penalty values for said particular vertex and, if so, eliminate an inferior one of said at least two of the plural different potential routing layer assignment combinations.

* * * * *